United States Patent [19]

Vangieson et al.

[11] Patent Number: 5,295,150
[45] Date of Patent: Mar. 15, 1994

[54] DISTRIBUTED FEEDBACK-CHANNELED SUBSTRATE PLANAR SEMICONDUCTOR LASER

[75] Inventors: Edward A. Vangieson, Lawrenceville; Pamela K. York, Trenton; John C. Connolly, Monmouth Junction, all of N.J.

[73] Assignee: Eastman Kodak Company, Rochester, N.Y.

[21] Appl. No.: 989,273

[22] Filed: Dec. 11, 1992

[51] Int. Cl.[5] .............................................. H01S 3/08
[52] U.S. Cl. ....................................... 372/96; 372/50
[58] Field of Search ....................... 372/45, 46, 50, 96

[56] References Cited

U.S. PATENT DOCUMENTS

| | | |
|---|---|---|
| 4,257,011 | 3/1981 | Nakamaura . |
| 4,622,673 | 11/1986 | Tsang .................................. 372/46 |
| 4,719,634 | 1/1988 | Steifer ................................. 372/50 |
| 4,809,288 | 2/1989 | Welch et al. ........................ 372/50 |
| 5,027,368 | 6/1991 | Kudo et al. . |
| 5,131,002 | 7/1992 | Mooradian ........................... 372/50 |

OTHER PUBLICATIONS

A. Takemoto et al "1.3-μm Distributed Feedback Laser Diode with a Grating Accurately Controlled by a New Fabrication Technique", published in *Journal of Lightwave Technology*, vol. 7, No. 12, Dec. 1989 pp. 2072-2076.

N. Yoshida et al., "InGaAsP/InP DFB Laser with a New Grating Structure by MOCVD", published in *Proceedings of International Electron Devices Meeting* of Dec., 1988 pp. 307-310.

B. Goldstein et al., "Efficient AlGaAs channeled-planar distributed feedback laser", published in *Applied Physics Letters*, vol. 53 (7), Aug. 15, 1988, pp. 550-552.

S. Takigawa et al. "Continuous room-temperature operation of a 75a9-nm GaAlAs distributed feedback laser", published in *Applied Physics Letters*, vol. 51 (20), Nov. 16, 1987, pp. 1580-1581.

*Primary Examiner*—Rodney B. Bovernick
*Assistant Examiner*—Robert E. Wise
*Attorney, Agent, or Firm*—Mark Z. Dudley

[57] ABSTRACT

A distributed feedback semiconductor diode laser includes a substrate of n-type gallium arsenide having a channel along one surface thereof. A first clad layer of n-type aluminum gallium arsenide is on the surface of the substrate. The first clad layer fills the channel and has a planar surface. An active layer of undoped aluminum gallium arsenide is on the first clad layer and a first spacer layer of p-type conductivity aluminum gallium arsenide is on the active layer. A grating layer of p-type conductivity aluminum gallium arsenide is on the first spacer layer and has a second order grating therein which extends across the channel in the substrate. A second spacer layer of p-type conductivity aluminum gallium arsenide is on the grating layer and a second clad layer of p-type conductivity aluminum gallium arsenide is on the second spacer layer. The content of aluminum in the second clad layer varies across its thickness from an amount less than that in the second spacer layer at its junction with the second spacer layer to an amount equal to that in the second spacer layer. A cap layer of n-type conductivity gallium arsenide is on the second clad layer and a p-type conductivity contact region extends through the cap layer to the second clad layer over the groove in the substrate. Conductive contacts are on the contact region and a second surface of the substrate. The composition and thicknesses of the active layer, spacer layers and grating layer are such as to provide the output beam of the diode laser with a relatively low divergence angle of about 27°.

25 Claims, 2 Drawing Sheets

DISTRIBUTED FEEDBACK-CHANNELED SUBSTRATE PLANAR SEMICONDUCTOR LASER

FIELD OF THE INVENTION

The present invention relates to a distributed feedback-channeled substrate planar (DFB-CSP) semiconductor laser, and, more particularly, to a DFB-CSP semiconductor laser which has a relatively narrow beam divergence and low threshold current operation.

BACKGROUND OF THE INVENTION

It has been found desirable to have a high-power index-guided diode laser operating in a wavelength-locked single longitudinal mode and with a well defined single lateral spatial mode. Such diode lasers have applications in space communications, optical recording and fiber-optics. To achieve such a diode laser, a channeled substrate planar (CSP) AlGaAs diode laser was developed. Such a diode laser has a channel in the substrate for lateral confinement and a clad layer over the substrate and filling the channel. The clad layer has a planar surface over which the active layer of the diode laser is grown epitaxially. This type of diode laser has all of the above desired properties except spectral stabilization.

In order to achieve both spectral and spatial stability, a channel substrate, planar, distributed. feedback diode laser was developed. Such a diode laser is described in an article entitled "Efficient AlGaAs channeled-substrate-planar-distributed feedback laser" by B. Goldstein et al., published in *Applied Physics Letters,* Vol. 53(7), Aug. 15, 1988, pages 550–552. This diode laser includes a grating to achieve spectral stability. The grating shown in this article is an interrupted grating in that it is positioned in the wings (shoulders) of the device on either side of a V-channel in the substrate. Although the structure displays distributed feedback characteristics and the desired spatial stabilization, the device exhibits distributed feedback behavior only over a limited temperature range (<10°C.) and the yield of the devices having these desired characteristics is very low (less than about 5%). The reason for this is that the optical mode only couples to the grating over the wings of the device and thereby provides a very low coupling coefficient, which describes the extent of the interaction between the optical field of the diode laser and the grating.

To enhance the interaction between the grating and the optical field, it has been suggested that the grating be positioned in the structure such that a greater portion of the optical mode interacts with the grating. Diode lasers having confined channels with a grating extending across the entire device are shown in U.S. Pat. No. 4,257,011 (M. Nakamura et al.), issued Mar. 17, 1981, and entitled "Semiconductor Laser Diode", in U.S. Pat. No. 5,027,368 (H. Kudo et al.), issued Jun. 25, 1991, and entitled "Semiconductor Laser Device" and in an article entitled "Continuous room-temperature operation of a 759-nm GaAlAs distributed feedback laser" by S. Takigawa et al., published in *Applied Physics Letters,* Vol. 51(20), Nov. 16, 1987, pages 1580–1581. Although this structure greatly increases the coupling efficiency, it also provides a large beam divergence of the emitted beam (as large as 50°). Such a beam divergence is undesirable for most applications requiring coupling to optical systems. A smaller beam divergence in the range of about 25° to 29° allows for more efficient use of the light output from the diode laser with a simple optical system.

To achieve a smaller beam divergence, a large optical cavity, distributed feedback-channeled substrate planar (LOC-DFB-CSP) semiconductor laser was developed. This laser, which is described in U.S. Patent application Ser. No. 07/651,076 (John C. Connolly et al.), filed Feb. 6, 1991, entitled "Semiconductor Diode Laser" and assigned to the assignee of the present application, comprises a substrate of n-type conductivity gallium arsenide having a channel along one surface thereof between its end surfaces. A first clad layer of n-type aluminum gallium arsenide is on the surface of the substrate. The first clad layer fills the channel and has a planar surface. A thin active layer of undoped aluminum gallium arsenide is on the clad layer and a spacer layer of p-type conductivity aluminum gallium arsenide is on the active layer. A grating layer of p-type conductivity aluminum gallium arsenide is on the spacer layer and has a second order grating therein which extends across the channel in the substrate. A second clad layer of p-type conductivity aluminum gallium arsenide is on the grating layer and a cap layer of n-type conductivity gallium arsenide is on the second clad layer. A p-type conductivity contact region extends through the cap layer to the second contact layer and is over the channel in the substrate. Conductive contacts are on the contact region and a second surface of the substrate. The composition and thicknesses of the active layer, spacer layer and grating layer are such as to provide the output beam of the diode laser with a relatively low divergence angle of about 27°.

The Connolly et al. LOC-DFB-CSP semiconductor laser described hereinabove is made using two different growth methods. After the groove is formed in the surface of the substrate, the first clad layer, the active layer, the spacer layer and the grating layer are grown in succession on the substrate using liquid phase epitaxy. After the grating is formed in the grating layer, the second clad layer and the cap layer are grown in succession using metalorganic chemical vapor deposition (MOCVD) techniques. The LPE process is used for the initial layers since it fills and planarizes the V-channel in the substrate which provides lateral mode confinement. The MOCVD process is used for the final layers on top of the grating layer since this provides for greater ease of regrowth on aluminum gallium arsenide.

Although this semiconductor laser provides a beam having a narrow divergence angle of about 27°, it cannot achieve low threshold current operation for a beam having a divergence angle of less than about 36°. Beam divergence decreases with increasing active layer thickness. A beam divergence of 30° or less requires an active layer thickness of less than 0.06 micrometers. However, threshold current increased rapidly for active layers having a thickness of less than about 0.07 micrometers. Lasers with thin active layers have a small optical confinement factor, which leads to a high threshold current. Thus, a narrow beam divergence of <27° is incompatible with low threshold current operation. Also, the use of LPE to grow the active layer leads to problems with regard to threshold current. The LPE growth process has an intrinsic layer thickness variation which is exacerbated for layers thinner than about 0.07 micrometers. Thin layers have a measured thickness variation across a wafer of about plus or minus 10–15 nanometers, or a percent variation of plus or minus 20–30% for nominally 0.05 micrometer thick layers. This leads to a large variation in the threshold current density and in the grating strength of the device. A greater uniformity in grating strength and in threshold current could be obtained if the minimum layer thickness of the active layer was increased to 0.07–0.09 micrometers. However, a small beam divergence of less than 27° cannot be simultaneously achieved for such layer thicknesses in the structure described above. Therefore, it would be desirable to have a DFB-CSP semiconductor laser which would have both a narrow beam divergence (less than 27°) and a low threshold current.

SUMMARY OF THE INVENTION

In one aspect, the present invention is directed to a semiconductor diode laser having a channeled substrate, planar structure with a grating across at least the channel for distributed feedback over a relatively wide temperature range, but which also includes means for achieving spatial stability, relatively high yield, small beam divergence and low threshold current. This is achieved by a diode laser having over the channeled substrate, first and second clad layers of opposite conductivity type, an active layer between the clad layers, a grating over the channel between the active layer and one of the clad layers and spacer layers at opposite sides of the grating. The thicknesses and composition of the active layer, spacer layers and grating layer are such as to provide the small beam divergence at a high coupling coefficient between the optical field and the grating. The one clad layer has a index of refraction which varies across its thickness from being greater than that of the adjacent spacer layer at its junction with the adjacent spacer layer to being the same as that of the adjacent spacer layer to provide the small beam divergence for a thicker active region which is necessary for low threshold currents.

As another aspect, the present invention is directed to a semiconductor diode laser which comprises a substrate of a semiconductor material of one conductivity type having first and second opposed surfaces and a channel extending along the first surface. A first clad layer of a semiconductor material of the one conductivity type is on the first surface of the surface. The first clad layer fills the channel and has a planar surface. An active layer of a semiconductor material is on the first clad layer and a first spacer layer of a semiconductor material of the opposite conductivity type is on the active layer. A grating layer of a semiconductor material of the opposite conductivity type is over the first spacer layer and has a grating therein which extend transversely across at least the channel in the substrate. A second spacer layer of a semiconductor material of the opposite conductivity type is on the grating layer, and a second clad layer of a semiconductor material of the opposite conductivity type is on the second spacer layer. The thicknesses and composition of the active layer, spacer layers, and grating layer is such as to provide a beam divergence of the light beam emitted by the diode laser in the range of about 25° and 29°. The second clad layer has an index of refraction which at the second spacer layer is greater than the index of refraction of the second spacer layer and decreases across the thickness of the second clad layer to a value equal to the index of refraction of the second spacer layer.

The invention will be better understood from the following more detailed description and claims taken with the accompanying drawings.

It should be understood that the drawings are not necessarily to scale.

DETAILED DESCRIPTION

Figure 1:
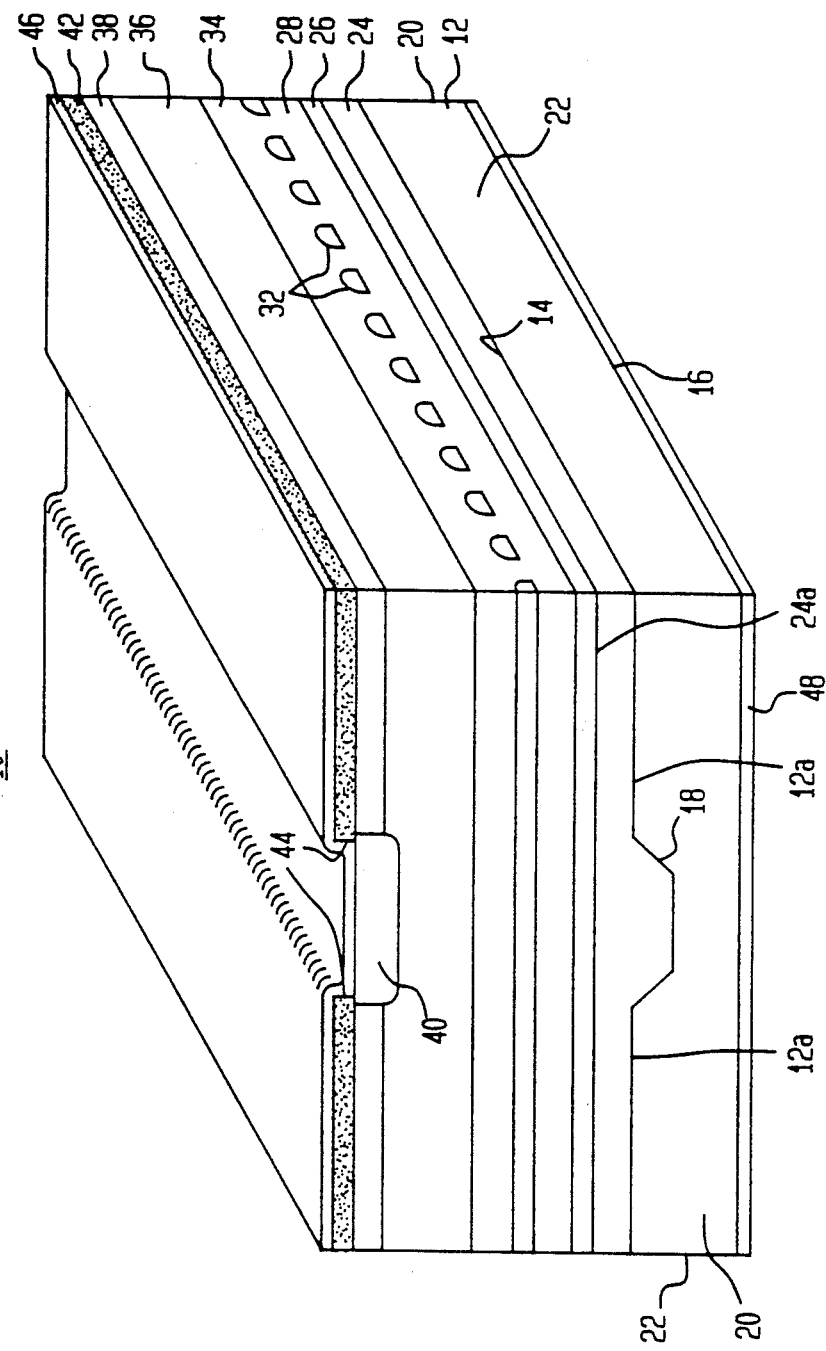
FIG. 1 is a perspective view of a semiconductor diode laser in accordance with the present invention.

Referring now to FIG. 1, there is shown a perspective view of a semiconductor diode laser 10 in accordance with the present invention. Diode laser 10 comprises a substrate 12 of a semiconductor material of one conductivity type, preferably silicon doped, n-type conductivity gallium arsenide (GaAs). The substrate 12 has first and second opposed orthoganol major surfaces 14 and 16. A channel 18 having a flat bottomed V is in the substrate 12 and extends to the major surface 14. In an illustrative embodiment, the channel 18 is about 5 micrometers wide and about 1 micrometer deep. The channel 18 extends longitudinally along the substrate 12 between end surfaces 20 thereof and intermediate side surfaces 22 of the substrate 12.

On the first major surface 14 of the substrate 12 is a first clad layer 24 of a semiconductor material of the one conductivity type (preferably n-type conductivity aluminum gallium arsenide, $Al_{0.40}Ga_{0.60}As$, which is doped with Sn to a level of $1 \times 10^{18}$ impurities/cm$^3$). The first clad layer 24 fills the channel 18 and has a planar surface 24a. In the illustrative embodiment, the first clad layer preferably has a thickness of about 1.3 micrometers in the channel 18 and about 0.3 micrometers over shoulder (winged) regions 12a of the substrate 12 on each side of the channel 18. A thin active layer 26 is over the first clad layer 24. The active layer 26 is of undoped semiconductor material, preferably $Al_{0.09}Ga_{0.91}As$. In the illustrative embodiment, the active layer 26 has a nominal thickness of between 0.07 and 0.09 micrometers. This material has a residual background doping which is normally n-type conductivity at a doping level of $5 \times 10^{16}$ impurities/cm$^3$. A first spacer layer 28 of p-type conductivity semiconductor material (preferably $Al_{0.40}Ga_{0.60}As$ doped with Ge to a level of $5 \times 10^{17}$ impurities/cm$^3$) is on the active layer 26. In the illustrative embodiment, first spacer layer 28 has a nominal thickness of about 0.23 micrometers.

On the spacer layer 28 is a grating formed of a plurality of spaced, parallel bars 32 of p-type conductivity semiconductor material (preferably $Al_{0.21}Ga_{0.79}As$ doped with Ge to a level of $5 \times 10^{17}$ impurities/cm$^3$). The grating bars 32 are formed by etching parallel, spaced grooves completely through a layer of the semiconductor material, preferably partially into the first spacer layer 28. Hereinafter, the grating bars may be denoted as grating layer 32. In the illustrative embodiment, the grating layer 32 has a nominal thickness of about 0.07 micrometers. The grating bars form a second order grating having a period of about 2400 Angstroms.

A second spacer layer 34 of p-type semiconductor material (preferably $Al_{0.40}Ga_{0.60}As$ doped with zinc to a level of $5\times10^{17}$ impurities/cm$^3$) is over the grating layer 32 and extends through the grooves between the bars 32 of the grating to the first spacer layer 28. In the illustrative embodiment, the second spacer layer 34 has a thickness over the grating layer 32 of between 0.1 and 0.2 micrometers. A second clad layer 36 of p-type conductivity semiconductor material (preferably aluminum gallium arsenide doped with zinc to a level of $5\times10^{17}$ impurities/cm$^3$) is over the second spacer layer 34. The composition of the second clad layer 36 is varied so that the amount of AlAs in the second clad layer 36 varies from 3 to 10% lower than that contained in the second spacer layer 34 at the second spacer layer 34 (more preferably from 5 to 10%) to an amount equal to that contained in the second spacer layer 34. Thus, for a second spacer layer 34 containing 40% AlAs, the second clad layer 36 may contain 30 to 35% AlAs at the second spacer layer 34 with the content of AlAs increasing to 40% at its surface away from the second spacer layer 34. Therefore, the second clad layer 36 may be of $Al_{0.30-0.35}Ga_{0.70-0.65}As$ at the surface of the second spacer layer 34 and vary in its content of AlAs to $Al_{0.40}Ga_{0.60}As$ at its surface away from the second spacer layer 34. In the illustrative embodiment, the second clad layer 36 is of a thickness of between 1.0 and 2.0 micrometers.

A cap layer 38 of n-type semiconductor material (preferably GaAs doped with selenium to a level of about $1\times10^{18}$ impurities/cm$^3$) is on the second clad layer 36. In the illustrative embodiment, the cap layer 38 is of a thickness of about 0.5 micrometers. A highly conductive p-type conductivity contact region 40 extends through the cap layer 38 into the second clad layer 36 directly over the channel 18. An insulating layer 42 (preferably of silicon dioxide) is over the cap layer 38. In the illustrative embodiment, the insulating layer 42 has a thickness of about 0.15 micrometers. The insulating layer 42 has an opening 44 therethrough directly over the contact region 40. A conductive contact layer 46 is over the insulating layer 42 and makes contact to region 40 through the opening 44. The contact layer 46 is of a material which makes good electrical contact with the p-type contact region 40. One suitable material is a tri-layer of first a film of titanium, then a film of platinum and finally a film of gold. A conductive contact layer 48 extends over the second major surface 16 of the substrate 12. The contact layer 48 is of a material which makes good electrical contact with n-type conductivity material. One suitable material is a tri-layer of first a film of gold-germanium alloy, then a film of nickel and finally a film of gold.

To make the diode laser 10, the channel groove 18 is first etched into the first major surface 14 of the substrate 12. The first clad layer 24 is then epitaxially deposited on the first major surface 14 of the substrate 12 and in the channel groove 18. This is done by liquid phase epitaxy (LPE) since this process not only fills the channel groove 18, but also provides the first clad layer 24 with planar surface 24a. The active layer 26 is then epitaxially deposited on the first clad layer 24 followed in succession by the first spacer layer 28 and the grating layer 32. The active layer 26, first spacer layer 28 and grating layer 32 are all also deposited by liquid phase epitaxy. The grating bars 32 are then formed from a semiconductor layer using holographic and etching techniques. The semiconductor layer used to form the grating bars 32 is etched completely therethrough and preferably the etching is continued slightly into the first spacer layer 28. The second spacer layer 34, second clad layer 36 and cap layer 38 are then epitaxially deposited in succession over the grating layer 32. These three layers are deposited by the well known metal organic chemical vapor deposition (MOCVD) technique. During the deposition of the second clad layer 36, the content of the AlAs in the layer is varied as described above so that the second clad layer 36 has a graded composition. The insulating layer 42 is then deposited on the cap layer 38 by chemical vapor deposition and the opening 44 is formed therethrough using well known photolithographic and etching techniques. Zinc is then diffused through the opening 44 into and through the cap layer 38 to form the contact region 40. Finally, the conductive contacts 46 and 48 are deposited by any well known technique for depositing the metals, such as deposition in a vacuum or sputtering. In this method of making the diode laser 10, the LPE technique is used for the initial layers (i.e., the first clad layer 24, active layer 26, first spacer layer 28 and grating layer 32) to achieve the filling of the channel groove 18 and for forming the planar surface. The MOCVD technique is used for the layers over the grating (i.e., the second spacer layer 34, second clad layer 36 and cap layer 38) to minimize problems associated with native oxide residues on the AlGaAs grating surface and meltback of the grating itself since its amplitude or height is very small.

In the diode laser 10, the first clad layer 24 provides confinement of the optical mode to the region of the channel 18 using both an effective index step created by the change in layer thickness from the channel region 18 to the shoulder region, and a loss mechanism by absorption of the optical mode in the shoulder region. The width of the channel 18 assures that the diode laser 10 operates in the lowest fundamental mode. The planarity, thickness, and composition of the first clad layer 24 is critical to the control of the lateral mode of this structure.

The active layer 26 provides a region for the injected carriers in the device to recombine efficiently and thereby generate the light. Both the composition and thickness of the active layer 26 are critical to the manner in which the optical mode spreads to adjacent layers in the structure. The thickness of the active layer in the diode laser 10 is increased over the thickness of the active layer in the Connolly et al. LOC-DFB-CSP diode laser previously described to 0.07 to 0.09 micrometers. This achieves a lower threshold current operation and improves the yield of the devices obtain from a single wafer. This increase in the thickness of the active layer would normally increase the divergence angle of the beam emitted from the diode laser 10. However, as will be explained, this is compensated for by the grading of the amount of AlAs in the second clad layer 36.

The first spacer layer 28 provides confinement for carriers in the active layer 26. However, its small thickness permits the light generated in the active layer 26 to spread and interact with the grating layer 32. Both the thickness and composition of the first spacer layer 28 is important to the manner in which the light is distributed to the various layer in the structure.

The composition and thickness of the grating layer 32 is chosen such that when it interacts with a portion of the optical mode, it causes reflection of both the forward and backward waves along the longitudinal direction in the laser 10 and thereby establishes distributed feedback (DFB) operation. By etching completely through the grating layer 32 into the first spacer layer 28 to form the grating, the grating height is fixed. This leads to a controlled grating coupling coefficient from device to device and from wafer to wafer. Thus, the performance characteristics of a manufacturable device is more consistent. Also, the increase in the thickness of the active layer 26 previously described, decreases the grating strength. To maintain the grating strength, the thickness of the grating layer 32 is increased. This has the benefit that the grating strength is more tolerant to the LPE thickness variations of the grating layer 32 which improves the manufacturing yields of the diode lasers 10.

The second spacer layer 34 extends between the grating bars 32. Since the second spacer layer 34 is of the same material as the first spacer layer 28, the grating bars 32 are completely surrounded by the same material. Thus, the grating bars 32 has the appearance of periodic wires. The grating bars enhance grating coupling while at the same time providing a smaller cross-section area than a continuous layer to reduce spreading of light from the active layer 26. The second spacer layer 30 also provides a planar surface.

The variation in the content of AlAs in the second clad layer 36 provides the second clad layer 36 with a variation in its index of refraction. The lower content of AlAs in the second clad layer 36 at the second spacer layer 34 provides that portion of the second clad layer 36 with a higher index of refraction than the second spacer layer 34. The index of refraction decreases across the thickness of the second clad layer 36 until it is equal to that of the second spacer layer 34 at the surface of the second clad layer 36 away from the second spacer layer 34. This grading of the composition of the second clad layer 36, which varies the index of refraction of the second clad layer 36, serves to spread out the near field in a way which narrows the divergence angle of the beam of light emitted by the diode laser 10 while retaining a large optical confinement factor and a large grating coupling coefficient for the thicker active layer 26. The larger the variation in the composition of the second clad layer 36 across its thickness, the smaller the divergence angle of the emitted beam. A variation of at least 3% and up to 10% has been found to provide smaller angles of beam divergence without adversely affecting the operation of the diode laser 10. Thus, for a second spacer layer 34 of aluminum gallium arsenide, the second clad layer 36 should have a content of AlAs at the surface of the second spacer layer 34 which is 3 to 10% less than that of the second spacer layer 34. The content of AlAs in the second clad layer 36 then increases to the same content as in the second spacer layer 34 at the surface of the second clad layer 36 away from the second spacer layer 34. For example, as described above, for a second spacer layer 34 of a composition of $Al_{0.40}Ga_{0.60}As$, and a second clad layer 36 whose composition of AlAs is from 5 to 10% less than that of the second spacer layer 34, the second clad layer 36 is of a composition of $Al_{0.35}Ga_{0.65}Al$ to $Al_{0.30}Ga_{0.70}As$ at its junction with the second spacer layer 34. The composition of the AlAs in the second clad layer 36 increases across the thickness of the layer until it is of the same composition as the second spacer layer 34 at its surface away from the second spacer layer 34.

Figure 2:
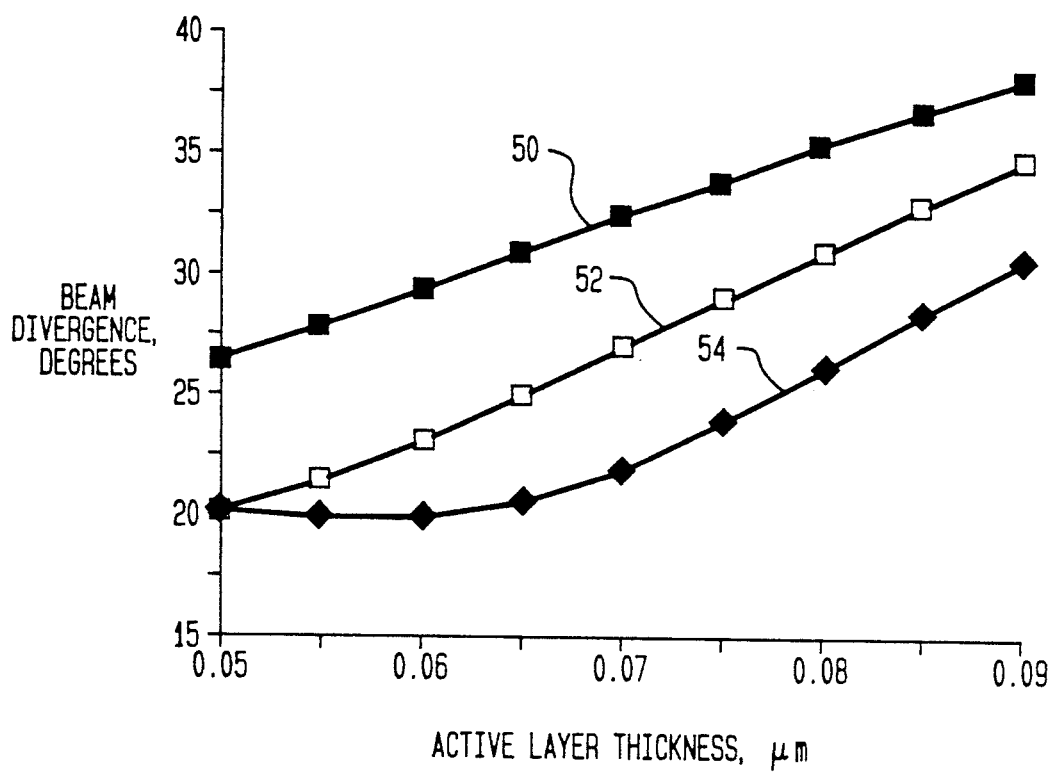
FIG. 2 is a graph showing the relationship of the beam divergence in degrees to the active layer thickness in micrometers for a semiconductor diode laser in accordance with the present invention having different differences in the range of the aluminum in the second spacer layer.

Referring now to FIG. 2 there is shown a graph of beam divergence in degrees vs. active layer thickness in micrometers for diode lasers 10 having different variations in the composition of the AlAs in the second clad layer 36. Line 50 is for a diode laser 10 having no variation in the composition of the second clad layer 36, i.e. a second clad layer 36 of uniform composition across its entire thickness. Line 52 is for a diode laser having a 5% change in the content of AlAs in the second clad layer 36, and line 54 is for a diode laser having a 10% change in the content of AlAs in the second clad layer 36. It can be seen from this graph that for any thickness of the active layer between 0.06 and 0.09 micrometers, as the variation in the amount of AlAs in the second clad layer 36 increases, the angle of the beam divergence decreases. Thus, grading the composition of the second clad layer 36 provides a small angle of beam divergence even for thicker active layers which provide for lower threshold currents.

The cap layer 38, which is highly conductive, serves as a current block and a contact layer. In a reverse bias mode of operation, the cap layer 38 effectively blocks the current flow everywhere except at the contact region 40 directly over the lasing region. This helps improve the efficiency of the diode laser 10. The cap layer 38 as a contacting layer is important since electrical contact on an AlGaAs layer is difficult and normally leads to high resistance causing excess heating in the diode laser 10. The contact region 40 provides for good low resistance electrical contact between the contact layer 46 and the second clad layer 36 in the region over the channel 18.

Thus, there is provided by the present invention a distributed feedback, channeled substrate, planar diode laser which has a relatively high output power, good spatial stability, small beam divergence and low threshold current. Also, by increasing the thickness of the active layer and grating layer, the effect of variations in the thicknesses of these layers by the LPE growth technique is reduced so that improved yield of the devices is achieved.

It is to be appreciated and understood that the specific embodiments of the invention are merely illustrative of the general principles of the invention. Various modifications may be made consistent with the principles set forth. For example, the thicknesses of the spacer layers, active layer and grating layer may vary to achieve the desired small beam divergence as long as they are properly related to each other. Still further, the composition of the various layers may be different as long as they have the necessary band gap differences to provide confinement of carriers and light.

What is claimed is:

1. A semiconductor diode laser comprising:
   a substrate of a semiconductor material of one conductivity type having first and second opposed surfaces and a channel extending along the first surface;
   a first clad layer of a semiconductor material of the one conductivity type on the first surface of the substrate, said first clad layer filling said channel and having a planar surface;
   an active layer of a semiconductor material on the first clad layer;
   a first spacer layer of a semiconductor material of the opposite conductivity type on the active layer;
   a grating layer of a semiconductor material of the opposite conductivity type over the spacer layer and having a grating therein which extends transversely across at least the channel in the substrate;

a second spacer layer of a semiconductor material of the opposite conductivity type on the grating layer;

a second clad layer of a semiconductor material of the opposite conductivity type on the second spacer layer;

the thicknesses and composition of the active layer, spacer layers, and grating layer being such as to provide a beam divergence of the light beam emitted by the diode laser in the range of about 25° to 29°, and the second clad layer having an index of refraction which at the second spacer layer is greater than the index of refraction of the second spacer layer and which decreases through the thickness of the second clad layer to a value equal to the index of refraction of the second spacer layer.

2. The semiconductor diode laser of claim 1 in which the composition of the second clad layer varies across its thickness to provide the variation in the index of refraction.

3. The semiconductor diode laser of claim 2 in which the second spacer layer and the second clad layer are of aluminum gallium arsenide with the content of aluminum in the second clad layer varying across the thickness of the second clad layer to vary the index of refraction thereof.

4. The semiconductor diode laser of claim 3 in which the content of aluminum in the second clad layer at its junction with the second spacer layer is less than the content of aluminum in the second spacer layer and the content of aluminum in the second clad layer increases across its thickness to an amount equal to the amount of aluminum in the second spacer layer.

5. The semiconductor diode laser of claim 4 in which the content of aluminum in the second clad layer at its junction with the second spacer layer is at least 5% less than the content of aluminum in the second spacer layer.

6. The semiconductor diode laser of claim 5 in which the content of aluminum in the second clad layer at its junction with the second spacer layer is between 5 and 10% less than the content of aluminum in the second spacer layer.

7. The semiconductor diode laser of claim 6 further comprising a cap layer of a semiconductor material of the one conductivity type over the second clad layer and a contact region of the opposite conductivity type extending through the cap layer into the second clad layer, said contact region being over the channel in the substrate.

8. The semiconductor diode laser of claim 7 in which the active layer is of a thickness of between 0.07 and 0.09 micrometers.

9. The semiconductor diode laser of claim 8 in which the clad layers, active layer, spacer layers and grating layer are of aluminum gallium arsenide with the first clad layer and spacer layers having the same content of aluminum and the active layer having a lower content of aluminum than the clad layers.

10. The semiconductor diode laser of claim 9 in which the grating layer has a content of aluminum higher than that of the active layer but lower than that of the clad layers.

11. The semiconductor diode laser of claim 10 in which the grating extends completely across the grating layer.

12. The semiconductor diode laser of claim 11 in which the grating is formed of spaced grooves extending completely through the grating layer to form spaced bars of the grating layer.

13. The semiconductor diode laser of claim 12 in which the second spacer layer extends through the grooves in the grating layer to the first spacer layer so that the bars of the grating are completely surrounded by the spacer layers.

14. The semiconductor diode laser of claim 13 in which the grating is a second order grating.

15. The semiconductor diode laser of claim 14 further comprising a conductive contact on the cap layer and in ohmic contact with the contact region, and a conductive contact in ohmic contact with the second surface of the substrate.

16. The semiconductor diode laser of claim 15 wherein the first conductivity type is n-type and the opposite conductivity type is p-type and the active layer is undoped.

17. A semiconductor diode laser comprising:

a substrate of n-type conductivity aluminum gallium arsenide having first and second opposed major surfaces, a pair of end surfaces and a pair of side surfaces; said substrate having a channel in the first major surface extending between the end surfaces;

a first clad layer of n-type conductivity aluminum gallium arsenide on said first surface of the substrate, said first clad layer filling the channel and having a planar surface;

an active layer of undoped aluminum gallium arsenide having a lower content of aluminum than the first clad layer on said first clad layer;

a first spacer layer of p-type conductivity aluminum gallium arsenide having the same content of aluminum as the first clad layer on the active layer;

a grating layer of p-type conductivity aluminum gallium arsenide having a content of aluminum greater than that of the active layer but less than that of the first clad layer on the spacer layer, said grating layer having a second order grating therein extending transversely across the channel in the substrate;

a second spacer layer of p-type conductivity aluminum gallium arsenide of the same content of aluminum as the first spacer layer on the grating layer; and a second clad layer of p-type conductivity aluminum gallium arsenide on the second spacer layer, the content of aluminum in the second clad layer at its junction with the second spacer layer being less than the content of aluminum in the second spacer layer and the content of aluminum in the second clad layer increasing through the thickness of the second clad layer to an amount equal to the amount of aluminum in the second spacer layer;

the thicknesses of the active layer, spacer layers and grating layer being such as to provide a beam divergence of the light beam emitted by the diode laser in the range of about 25° and 29°.

18. The semiconductor diode laser of claim 17 in which the content of aluminum in the second clad layer at its junction with the second spacer layer is at least 3% less than the content of aluminum in the second spacer layer.

19. The semiconductor diode laser of claim 18 in which the content of aluminum in the second clad layer at its junction with the second spacer layer is between 5 and 10% less than the content of aluminum in the second spacer layer.

20. The semiconductor diode laser of claim 19 further comprising a cap layer of n-type conductivity gallium arsenide over the second clad layer and a contact region of p-type conductivity extending through the cap layer to the second clad layer over the groove in the substrate.

21. The semiconductor diode laser of claim 20 in which the active layer is of a thickness of between 0.07 and 0.09 micrometers.

22. The semiconductor diode laser of claim 21 in which the grating extends completely across the grating layer.

23. The semiconductor diode laser of claim 22 in which the grating is formed by spaced grooves extending completely through the grating layer to form spaced bars of the grating layer.

24. The semiconductor diode laser of claim 23 in which the second spacer layer extends through the grooves in the grating layer to the first spacer layer so that the bars of the grating are completely surrounded by the semiconductor material of the spacer layers.

25. The semiconductor diode laser of claim 24 further comprising a conductive contact on the cap layer and in ohmic contact with the contact region, and a conductive contact in ohmic contact with the second surface of the substrate.

* * * * *